United States Patent
Suzuki et al.

(10) Patent No.: US 6,562,417 B2
(45) Date of Patent: May 13, 2003

(54) DEPOSITING METHOD AND A SURFACE MODIFYING METHOD FOR NANO-PARTICLES IN A GAS STREAM

(75) Inventors: Nobuyasu Suzuki, Kanagawa (JP); Toshiharu Makino, Kanagawa (JP); Yuka Yamada, Kanagawa (JP); Takehito Yoshida, Kanagawa (JP)

(73) Assignee: Matsushita Electronic Industrial Co., Ltd., Osaka (JP)

( * ) Notice: Subject to any disclaimer, the term of this patent is extended or adjusted under 35 U.S.C. 154(b) by 0 days.

(21) Appl. No.: 10/180,054

(22) Filed: Jun. 27, 2002

(65) Prior Publication Data

US 2003/0003241 A1 Jan. 2, 2003

(30) Foreign Application Priority Data

Jun. 27, 2001 (JP) ........................................ 2001-195521

(51) Int. Cl.$^7$ ................................................ B05D 3/06
(52) U.S. Cl. ...................... 427/566; 427/180; 427/294; 427/299; 427/421; 427/444; 427/458; 427/475; 427/551; 427/553; 427/554; 427/558; 427/561; 427/595; 427/596
(58) Field of Search .................................. 427/566, 180, 427/294, 299, 421, 444, 458, 475, 551, 553, 554, 558, 561, 595, 596

(56) References Cited

PUBLICATIONS

Suzuki et al, "Structures and optical properties of silicon nanocrystallites prepared by pulsed–laser ablation in inert background gas" *Applied Physics letters* 76 (11) : 1389–1391, (2002) (No month avail.).

*Primary Examiner*—Bernard Pianalto
(74) *Attorney, Agent, or Firm*—Browdy and Neimark, P.L.L.C.

(57) ABSTRACT

A method of depositing nano-particles in a gas stream for efficiently depositing nano-particles by irradiating an electron beam on charged nano-particles in the stream of a first gas species containing the nano-particles, as well as a method of modifying the surface of the nano-particles in a gas stream by mixing them with the first gas species in a gas mixing chamber thereby activating the second gas species, intended for providing a method of depositing nano-particles and a method of modifying the surface thereof in a gas stream, capable of efficiently depositing the nano-particles in a charged state in a gas stream and modifying the surface of the nano-particles which are extremely sensitive to defects and impurities caused by large exposure ratio of surface atoms in a gas stream at a good controllability.

7 Claims, 4 Drawing Sheets

DEPOSITING METHOD AND A SURFACE MODIFYING METHOD FOR NANO-PARTICLES IN A GAS STREAM

BACKGROUND OF THE INVENTION

1. Field of the Invention

The present invention relates a depositing method and a surface modifying method for nano-particles in a gas stream and, more in particular, it relates to a depositing method and a surface modifying method for nano-particles in a gas stream capable of efficiently depositing nano-particles with a particle diameter of less than 100 nm for which development of various functions not obtainable in their bulk state can be expected based on the quantum size effect under a charged state in a gas streams, and capable of the modifying the surface of the nano-particles which are extremely sensitive to defects or impurities caused by a large exposure ratio of surface atoms at a good controllability in the gas stream.

2. Related Art

When a material is reduced into the size of nano-particles having a particle diameter of less than 100 nm, it sometimes develops physical property and function not shown in the bulk state thereof. Referring, for example, to the light emitting function, it has been known that even group IV elements such as silicon (Si) and germanium (Ge) which are indirect transition semiconductor and scarcely emit light in their bulk state emit intense visible lights at a room temperature when they are reduced into nano-particles of several nm diameter. However, since the ratio of atoms exposed on the surface is extremely large in nano-particles (reaching 40% at the grain diameter of 5 nm), the nano-particles are extremely sensitive to the intrusion of impurities or presence of crystal defects and it has been so far considered difficult for the development of them into high functional devices.

For example, in a case of Si nano-particles, it is described that Si nano-particles formed in an atmospheric gas show a quantum size effect as the optical characteristic which is not obtainable in their bulk state as shown in the literature ("Structures and Optical Properties of Silicon Nanocrystals Prepared by Pulsed-Laser Ablation in Inert Background Gas", Appl. Phys. Lett. Vol. 76 pp 1389–1391, 2000).

When nano-particles in a state charged to single polarity are deposited, deposits are charged as the amount of deposition increases, particularly, in semiconductors or insulator materials, in which repulsion exerts between nano-particles and deposits, and the amount of deposition is sometimes saturated when deposition is conducted to a predetermined amount or more.

Further, in a case of using nano-particles as they are or by assembling nano-particles for functional materials or functional devices, it is necessary to suppress coalescence and agglomeration of nano-particles and arranging them irregularly or regularly in a predetermined pattern on a substrate in order to possess the functionality inherent to the size. However, since the nano-particles of the size concerned in this invention has high surface activity and remarkable lattice-softening or melting effect on the surface, it has been difficult by the existent method for suppression of coalescence and agglomeration, or regular or irregular arrangement. In a case where nano-particles or an assembly of nano-particles as functional materials or functional devices, it is necessary for treatments to further emphasize the characteristic of the nano-particles or provide different kinds of functions. However, the treatment mentioned above tends to deteriorate the characteristic inherent to the nano-particles.

SUMMARY OF THE INVENTION

This invention provides a method of suppressing saturation for the deposition amount of nano-particles by providing a step of neutralizing static charges for nano-particles charged to a single polarity in a gas stream before a collecting/deposition step, as well as modifying the surface modification of nano-particles by providing a step of mixing a first gas species for carrying nano-particles and a second gas species for conducting surface modification and a step of activating a gas mixture of the first gas species and the second gas species and nano-particles carried on the gas mixture before the collecting/deposition step.

In accordance with the method described above, charged nano-particles in the gas stream can be deposited efficiently, and the surface of the nano-particles extremely sensitive to defects or impurities caused by the large exposure ratio of the surface atoms can be modified in the gas stream at a good controllability.

The method of depositing the nano-particles according to the invention has a feature comprising a step of neutralizing charges of the nano-particles charged to the single polarity in the gas stream before the collection/deposition step. This provides an effect of efficient deposition while suppressing saturation of the deposition amount of the charged nano-particles in the gas stream.

This invention further provides a particle deposition method which includes neutralizing charges by the irradiation of ultraviolet rays in vacuum, or neutralizing charges by the irradiation of electron beams in a step of neutralizing the charges of the nano-particles upon deposition of the nano-particles. In accordance with method, high vacuum can be kept in the collection/deposition step to improve the cleanness in the process, as well as can increase the inertial force of the particles in the gas stream to locally conduct centralized deposition.

Further, this invention provides a surface modifying method for particles including a step of mixing a first gas species for carrying the nano-particles and a second gas species for modifying the surface and a step of irradiating ultraviolet rays in vacuum for a gas mixture of the first gas species and the second species and nano-particles carried on the gas mixture before the collection/deposition step. This method provides an effect of activating the second gas species thereby causing them to react with the nano-particles to modify the surface of the nano-particles.

Further, this invention provides a surface modifying method for particles in which the ultraviolet rays for activating the second gas species is an excimer laser light. By the use of the excimer laser light of favorable shaping property, the second gas species can be activated at a good controllability.

Furthermore, this invention provides a surface modifying method for particles including a step of mixing a first gas species for carrying nano-particles and a second gas species for modifying the surface, and a step of irradiating an electron beam to a gas mixture of a first gas species and a second gas species and nano-particles carried on a gas mixture before a collection/deposition step. This method can maintain high vacuum in the collection/deposition step to improve the cleanness of the process, as well as can increase the inertial force of the surface modified nano-particles to locally conduct centralized deposition.

Furthermore, this invention provides a surface modifying method for particles including a step of mixing a first gas species carrying nano-particles and second gas species applying surface modification and a step of radiation-heating by infrared rays a gas mixture of a first gas species and a second gas species and nano-particles carried on a gas mixture before a collection/deposition step. This method can control the thickness of a modified portion formed on the surface of the nano-particles by applying heat treatment to the nano-particles and the second gas species simultaneously.

As has been described above, according to this invention, charged nano-particles in the gas stream can be deposited efficiently, as well as nano-particles extremely sensitive to defects or impurities caused by large exposure ratio of surface atoms can be surface modified in the gas stream at a good controllability.

Accordingly, this invention intends at first to provide an excellent method of depositing nano-particles in a gas stream, as well as a surface modifying method capable of efficiently depositing nano-particles with the particle diameter of less than 100 nm for which development of various functions not obtainable in their bulk due to the quantum size effect, in a charged state in a gas stream regarding deposition and surface modification of nano-particles in the gas stream.

This invention further intends to provide an excellent deposition method and a surface modifying method for nano-particles in a gas stream capable of applying surface modification to nano-particles sensitive to defects or impurities caused by large exposure ratio of surface atoms in a gas stream at a good controllability.

DESCRIPTION OF THE PREFERRED EMBODIMENTS

Preferred embodiments of a deposition method and a surface modifying method for nano-particles in a gas stream according to this invention will be explained in details with reference to FIG. 1 to FIG. 4.

Figure 1:
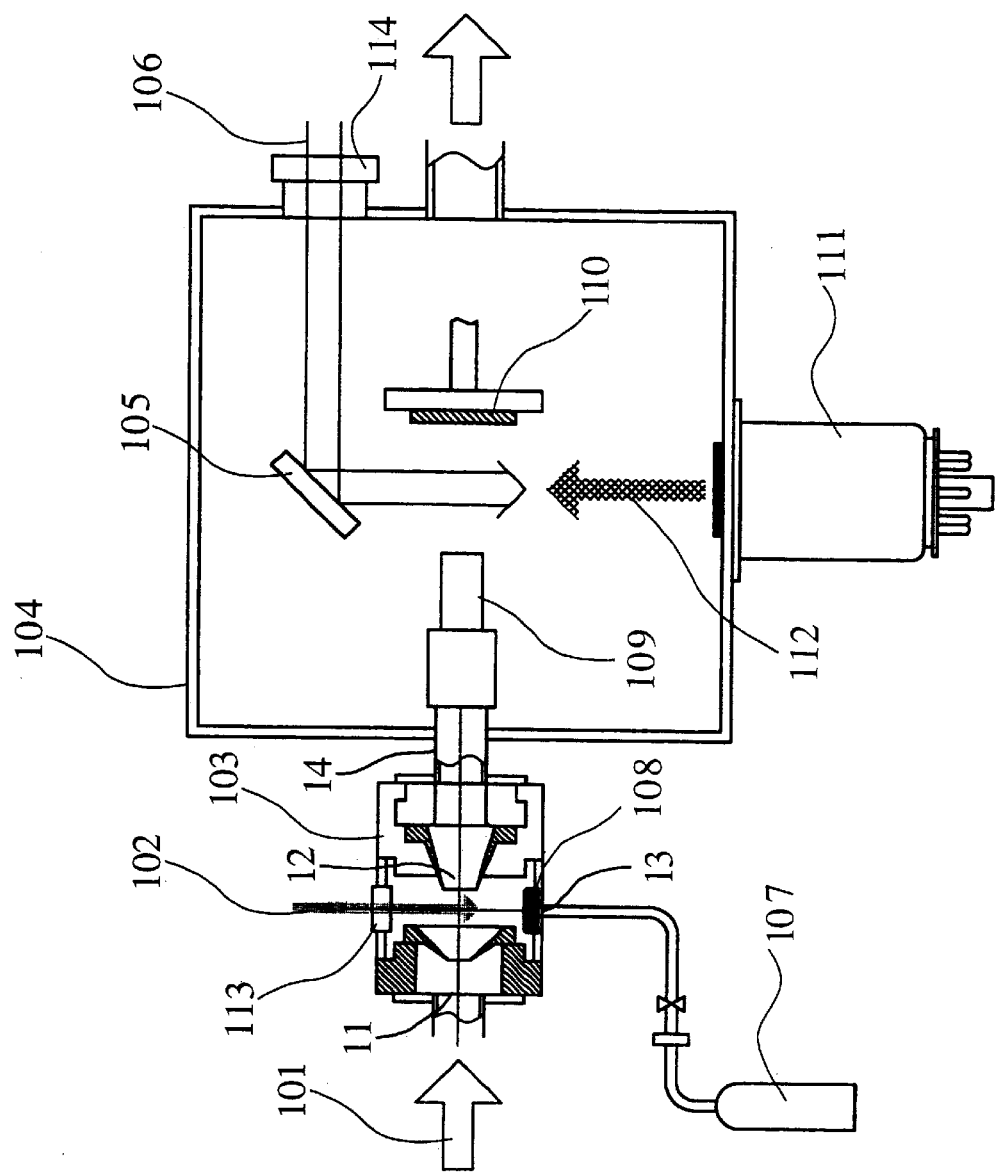
FIG. 1 shows a portion for the constitution of an apparatus in a preferred embodiment according to this invention.

FIG. 1 is a cross sectional view illustrating a main portion for the constitution of a nano-particle deposition/modification apparatus used for practicing a deposition method and a surface modifying method for nano-particles according to this invention. The nano-particles deposition/modification apparatus comprises a gas mixing chamber 103 for mixing a first gas species carrying nano-particles and a second gas species for applying surface modification to the nano-particles, and a nano-particles collection/deposition chamber 104 connected with the gas mixing chamber 103.

The gas mixing chamber 103 comprises an atmospheric gas inlet 11 for introducing a mixture of a gas as the first gas species and nano-particles, a gas exits 12 for flowing out the gas mixture, and a gas introduction portion 13 for introducing a gas as the second gas species into gas mixing chamber 103. In this embodiment, a helium gas is used as the first gas species, while an oxygen gas is used as the second gas species, for instance. Then, an oxygen gas reservoir 107 for supplying an oxygen gas to the gas mixing chamber 103 is connected to the gas introduction portion 13. Further, the gas mixing chamber 103 is provided with a porous ceramic body 108 for introducing an oxygen gas at a predetermined mass flow rate (0.01 SLM) from the oxygen gas reservoir 107 disposed to the gas introduction portion 13 to the inside of the gas mixing chamber 103, and an IR-ray introduction window 113 for introducing radiated IR-rays 102 to the inside of the gas mixing chamber 103. An appropriate light guiding material such as synthetic quartz is used for the IR-ray introduction window 113.

The nano-particle collection/deposition chamber 104 is connected by way of a gas line 14 with the gas mixing chamber 103. The nano-particle collection/deposition chamber 104 comprises a nozzle 109 disposed to the top end of the gas line 14, a deposition substrate 110 on which nano-particles in the gas mixture entering from the nozzle 109 to the inside of the nano-particle collection/deposition chamber 104 are deposited, a laser light introduction window 114 for introducing an excimer laser light 106 to the inside of the nano-particle collection/deposition chamber 104, a deflection mirror 105 for deflecting an optical path of the excimer laser light 106 introduced into the nano-particle collection/deposition chamber 104 at a predetermined angle in the chamber and irradiating the same onto the flow path of the gas mixture containing the nano-particles, and an electron beam irradiation device 111 for irradiating an electron beam 112, separately, from the excimer laser light 106, to the inside of the nano-particle collection/deposition chamber 104.

The operation of the nano-particle deposition/modification apparatus having thus been constituted is to be explained below. Deposition of nano-particles in a charged state in a gas stream is to be explained with reference to FIG. 1 to FIG. 3. At first, silicon nano-particles (particle diameter: 3 nm) formed by laser ablation in inert background gas method or a sputtering method and controlled a size distribution of nano-particles, for example, by a differential electrical mobility analyzing method and they are introduced together with the helium gas 101 at high purity (impurity concentration: 0.5 ppb or less) which is an atmospheric gas during formation and flowing at a predetermined mass flow rate (1.0 SLM) by way of the nozzle 109 into the nano-particle collection/deposition chamber 104.

As the starting material for the nano-particles, silicon is mentioned, for example, but the starting material for the nano-particles has no particular restriction and germanium which is a group IV semiconductor or compounds of metal, oxides, nitrides such as tungsten or platinum having high melting points may also be used, like silicon, as the starting material.

Figure 2:
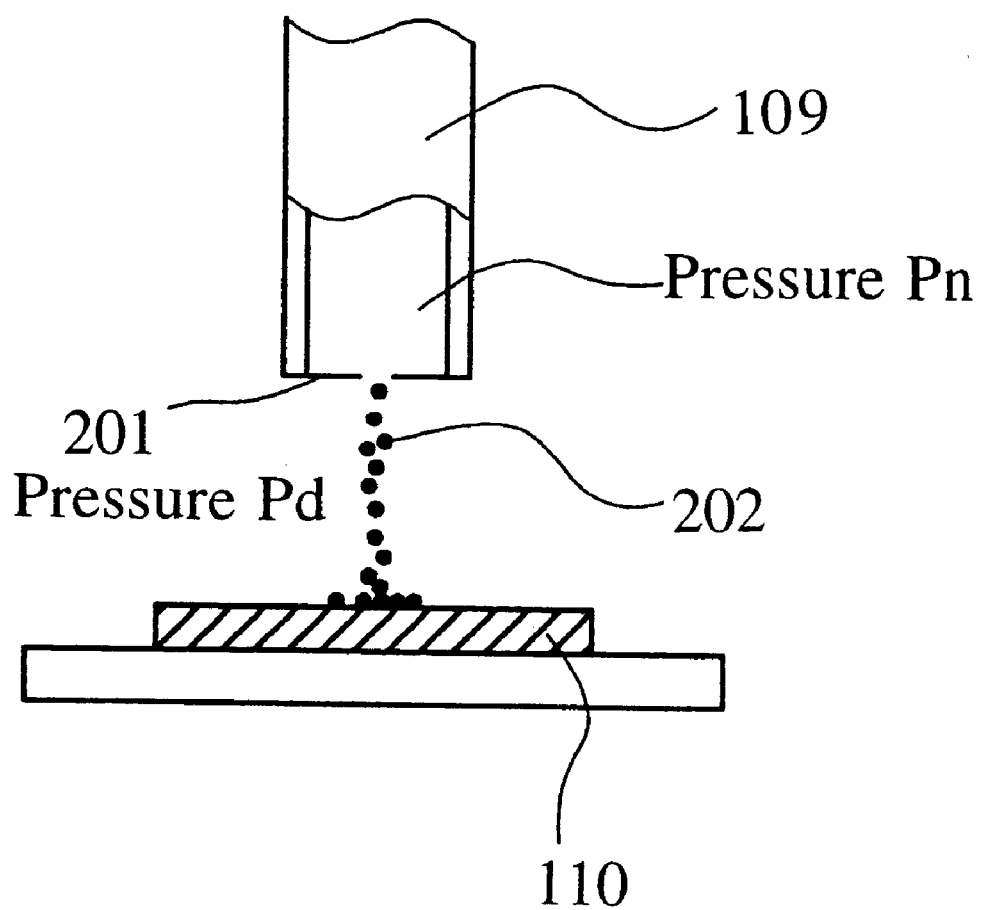
FIG. 2 is an explanatory view for the constitution near a substrate for collecting and depositing nano-particles in a preferred embodiment according to this invention.

In this embodiment, an orifice 201 is disposed to the nozzle 109 as shown in FIG. 2. When the diameter for the orifice 201 is chosen appropriately (for example, 1 mm diameter) and the nano-particle collection/deposition chamber 104 is pumped by differential operation by using a variable conductance exhaust system of large exhaustion flow rate using, for example, a helical pump (exhaust capacity of 440 l/s), the pressure Pn in the nozzle and the pressure Pd in the nano-particle collection/deposition chamber can be controlled, for example, as Pn=5.0 Torr and Pd=1×10$^{-4}$ Torr. By increasing the pressure difference, the inertial force of the nano-particles 202 in the gas stream can be increased and the nano-particles 202 can be centrally deposited locally on the deposition substrate 110.

Figure 3A:
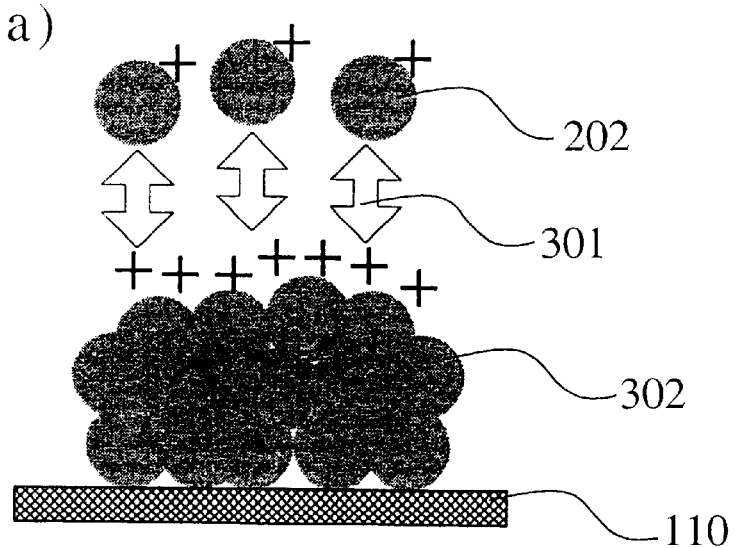
FIG. 3 is a an explanatory view showing the process for neutralizing deposition of charged nano-particles in a preferred embodiment according to this invention.
Figure 3B:
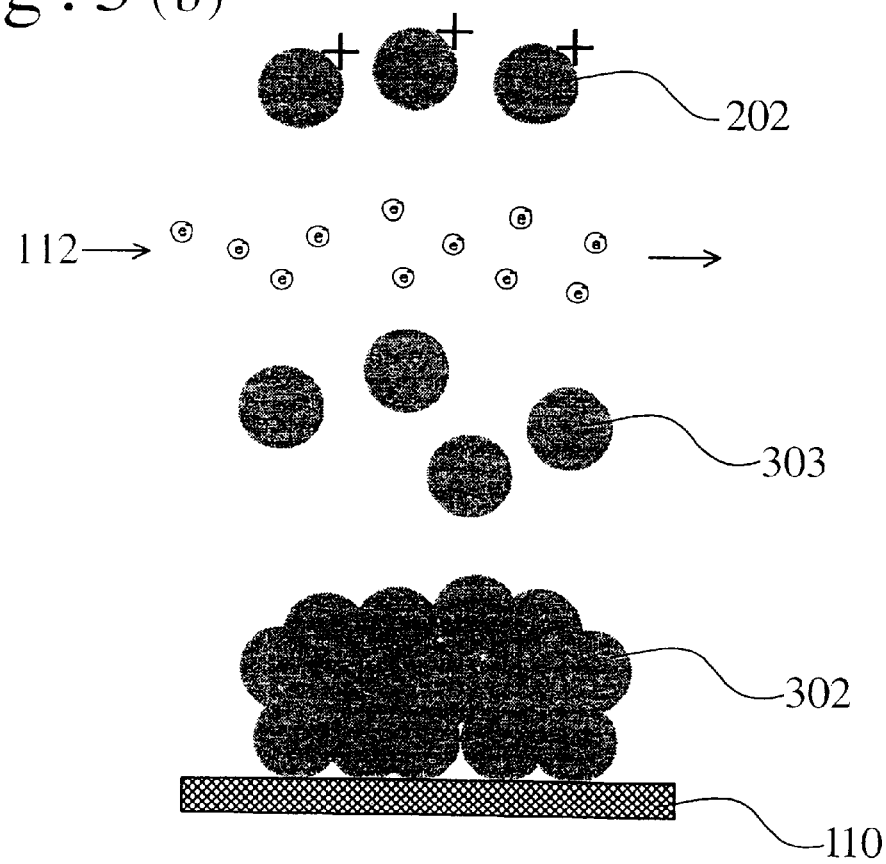

Then, the nano-particles 202 jetted out of the nozzle 109 are collected and deposited on the deposition substrate 110. As shown in FIG. 3(a), static charges can be released to the deposition substrate 110 at the initial stage of deposition and, along with increase of the deposition amount, they are brought into a charged stage. This is identical also in a case where the starting material is an insulator. Repulsion exerts between the charged deposits 302 and the charged nano-particles 202 and, as a result, the deposition amount is decreased tending to reach saturation. In view of the above, for suppressing the saturation of the deposition amount, the electron beam irradiation device 111 is disposed in the nano-particle collection/deposition chamber 104. When the electron beam 112 is irradiated to the charged nano-particles 202, charged nano-particles 202 are converted into neutralized nano-particles 304 as shown in FIG. 3(b) and collected/deposited by the inertial force in the gas stream described above with no saturation of the deposition amount on the deposition substrate 110. By eliminating the repulsion 301 exerting between the charged nano-particles 202 and the deposits 302, the deposition amount per unit time can also be estimated and, thus, the deposition amount can be controlled exactly.

Figure 4A:
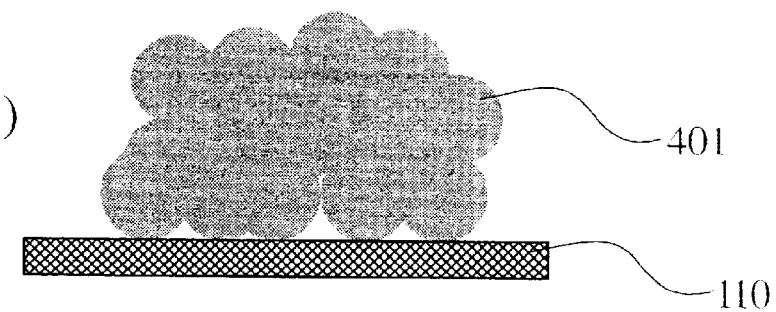
FIG. 4 is a an explanatory view showing a surface modification process and a deposition structure of nano-particles in a preferred embodiment according to this invention.
Figure 4B:
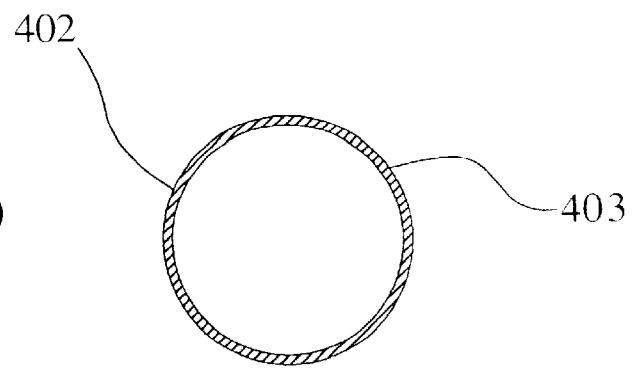
Figure 4C:
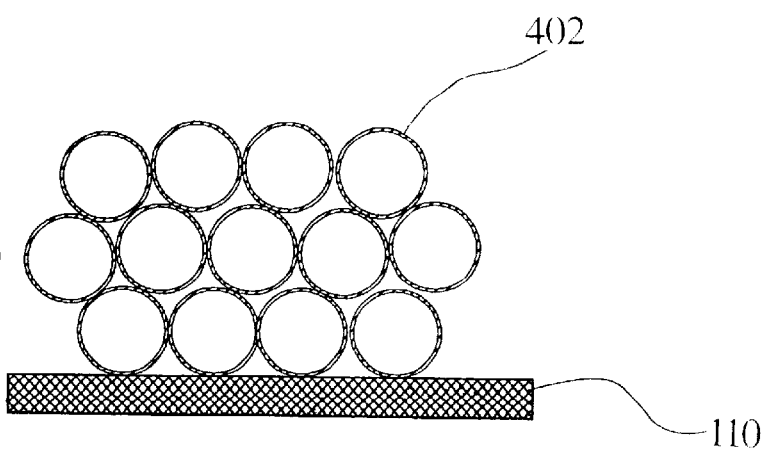

Then, surface modification for the nano-particles in the gas stream is explained with reference to FIG. 1 and FIG. 4. At first, silicon nano-particles (particle diameter: 3 nm) formed, for example, by pulsed laser ablation in inert background gas method or a sputtering method and controlled the size distribution of nano-particles, for example, by a differential electrical mobility analyzing method or the like are entered together with the helium has 101 at a high purity (impurity concentration: 0.5 ppb or less), which is an atmospheric gas upon formation and flows at a predetermined gas flow rate (0.99 SLM) into the gas mixing chamber 103.

In this embodiment, the gas mixing chamber 103 is provided, for example, with the porous ceramic body 108 for introducing an oxygen gas at a predetermined mass flow rate (0.01 SLM) from the oxygen gas reservoir 107 and an IR-ray introduction window 113 for introducing irradiated IR-ray 102. While oxygen is referred to as an example of the gas species for surface modification, the gas species has no particular restriction only thereto but it may be nitrogen or hydrogen, or an aerosol containing organic molecules.

Then, the helium gas 101 containing the nano-particles entering into the gas mixing chamber 103 is mixed with an oxygen gas introduced through the porous ceramic body 108 and the gas mixture containing the nano-particles enters by way of the nozzle 109 at a predetermined mass flow rate (1.0 SLM) by way of the nozzle 109 into the nano-particle collection/deposition chamber 104. The nano-particles 202 jetted out of the nozzle 100 are collected/deposited on the deposition substrate 110. As shown in FIG. 3(*b*), since the deposits 302 have high surface activity as the characteristic of the nano-particles and the lattice-softening effect or the melting effect on the surface are remarkable, coalescence or agglomeration occurs tending to form coalescence/coagulation products 401 that hinder the development of function of the single nano-particle single body (FIG. 4(*a*)).

In view of the above, for suppressing the occurrence of agglomeration or coalescence and maintaining the individual independence of nano-particles, the laser light introduction window 114 is disposed to the nano-particle collection/deposition chamber 104, and the excimer laser light 106 shaped into 10 mm square (ArF excimer laser: at 193 nm wavelength) is deflected at the deflecting mirror 105 and irradiated to the flow path of the gas mixture containing the nano-particles thereby activating the oxygen gas in the gas mixture to form surface modified nano-particles 401 covered at the surface with an oxide layer 402 as shown in FIG. 4(*b*), by which nano-particles 401 surface modified to a state with no coalescence or agglomeration can be deposited as shown in FIG. 4(*c*) and deposits not deteriorating the characteristic inherent to the nano-particles can be obtained. Thus, a nano-particle assembly capable of exhibiting the characteristic inherent to the nano-particles which are packed closest in the three dimensional manner and arranged regularly can be obtained. For the activation of the oxygen gas, the electron beam 112 irradiated from the electron beam irradiation device 111 can also be used. In this case, since parts for introducing the excimer laser light 106 are no more required, the apparatus can be reduced in the size and made simple and convenient.

Then, a method of using an IR-ray radiation regarding the surface modification of the nano-particles in the gas stream is to be explained with reference to FIG. 1 and FIG. 4. At first, the silicon nano-particles (grain size: 3 nm) formed, for example, by a rare gas atmosphere laser ablation method or a sputtering method and controlled to a single grain size in a grain size distribution, for example, by a differentiation type electrical mobility classification method enters together with the helium gas 101 at a high purity (impurity concentration: 0.5 ppb or less), which is an atmospheric gas upon preparation and flowing at a predetermined mass flow rate (0.99 SLM) into the gas mixing chamber 103.

In this case, the gas mixing chamber 103 is provided, for example, with the porous ceramic body 108 for introducing the oxygen gas from the oxygen gas reservoir 107 at a predetermined mass flow rate (0.01 SLM), and the IR-ray introduction window 113 for introducing the radiated IR-ray 102. While oxygen is referred to as an example of the gas species for surface modification, there is no particular restriction on the gas species but it may be nitrogen or hydrogen or an aerosol containing organic molecules.

Then, nano-particles carried by the helium gas to the gas mixing chamber 103 are heated in a mixed gas atmosphere formed by mixing the oxygen gas and the helium gas introduced from the porous ceramic body 108, for example, up to 1000° C. by the IR rays 102 irradiated by way of the IR-ray introduction window 113. By the heat treatment, the nano-particles are converted into surface modified nano-particles 401 covered at the surface with an oxide film 402 as shown in FIG. 4(*b*) Then, the surface modified nano-particles 401 are collected/deposited by way of the nozzle 109 on the deposition substrate 110. The deposited nano-particles are in the state free of coalescence/agglomeration as shown in FIG. 4(*c*) and deposits not deteriorating the characteristic inherent to the nano-particles can be obtained. Thus, a nano-particle assembly packed closest and arranged regularly in a three dimensional manner capable of providing the characteristic inherent to nano-particles can be obtained.

As described above, by the method of suppressing the saturation of the deposition amount of the nano-particles by providing the step of neutralizing charges of the nano-particles charged to a single polarity in the gas stream before collection/deposition step, as well as a surface modifying method for nano-particles by providing a step of mixing the first gas species carrying the nano-particles and a second gas species for surface modification and a step of activating the second gas species for the gas mixture of the first gas species and the second gas species and the nano-particles carried on the gas mixture before the collection/deposition step, nano-particles in a charged state in the gas stream can be deposited efficiently, as well as surface modification for the nano-particles which are extremely sensitive to defects or impurities caused by large exposure ratio of the surface atoms can be conducted in a gas stream at a good controllability.

While the invention has been described with reference to preferred embodiments illustrated in the drawings, it will be understood by those skilled in the art that various changes and modifications may be made therein and also such modifications fall within the scope of the invention.

What is claimed is:

1. A method of depositing particles comprising a step of neutralizing charges for nano-particles charged to a single polarity in a gas stream before a collection/deposition step.

2. A method of depositing particles according to claim 1, wherein charges are neutralized by irradiation of ultraviolet light in vacuum in the step of neutralizing the charges.

3. A method of depositing particles according to claim 1, wherein charges are neutralized by irradiation of an electron beam in the step of neutralizing the charges.

4. A method of modifying the surface of particles comprising a step of mixing a first gas species carrying nano-particles and a second gas species for applying surface modification to the nano-particles, and a step of irradiating ultraviolet rays to a gas mixture of the first gas species and the second gas species, and the nano-particles carried on the gas mixture before a collection/deposition step.

5. A method of modifying the surface of particles according to claim 4, wherein the ultraviolet rays in vacuum are excimer laser light.

6. A method of modifying the surface of particles comprising a step of mixing a first gas species for carrying nano-particles and a second gas species for applying surface modification and a step of irradiating an electron beam to a gas mixture of the first gas species and the second gas species and the nano-particles carried on the gas mixture before a collection/depositions step.

7. A method of modifying the surface of particles comprising a step of mixing a first gas species for carrying nano-particles and a second gas species for applying surface modification and a step of heating by IR-ray radiation to a gas mixture of the first gas species and the second gas species and the nano-particles carried on the gas mixture before a collection/depositions step.

* * * * *